(12) United States Patent       (10) Patent No.:     US 8,906,195 B2
Srivastava et al.              (45) Date of Patent:      Dec. 9, 2014

(54) TUNING HARDWARE FOR PLASMA ASHING APPARATUS AND METHODS OF USE THEREOF

(75) Inventors: Aseem K. Srivastava, Andover, MA (US); Robert P. Couilliard, Plaistow, NH (US)

(73) Assignee: Lam Research Corporation, Fremont, CA (US)

( * ) Notice: Subject to any disclaimer, the term of this patent is extended or adjusted under 35 U.S.C. 154(b) by 787 days.

(21) Appl. No.: 12/621,136

(22) Filed: Nov. 18, 2009

(65) Prior Publication Data

US 2011/0114115 A1    May 19, 2011

(51) Int. Cl.
*C23C 16/00* (2006.01)
*C23F 1/00* (2006.01)
*H01L 21/306* (2006.01)
*H01J 37/32* (2006.01)

(52) U.S. Cl.
CPC ..... *H01J 37/32192* (2013.01); *H01J 37/32256* (2013.01)
USPC .............................. 156/345.41; 118/723 MW (58) Field of Classification Search
USPC ................ 156/345.36, 345.41; 118/723 MW, 118/723 ME, 723 R
See application file for complete search history.

(56) References Cited

U.S. PATENT DOCUMENTS

| | | | |
|---|---|---|---|
| 4,585,668 A | 4/1986 | Asmussen et al. | |
| 4,689,459 A * | 8/1987 | Gerling | 219/694 |
| 4,851,630 A | 7/1989 | Smith | |
| 4,943,345 A * | 7/1990 | Asmussen et al. | 216/69 |
| 5,079,507 A | 1/1992 | Ishida et al. | |
| 5,749,966 A | 5/1998 | Shates | |
| 6,016,766 A | 1/2000 | Pirkle et al. | |
| 6,057,645 A | 5/2000 | Srivastava et al. | |
| 6,066,992 A | 5/2000 | Sadaka et al. | |
| 6,132,550 A * | 10/2000 | Shiomi | 156/345.41 |
| 6,261,525 B1 | 7/2001 | Minaee | |
| 6,439,155 B1 * | 8/2002 | Kamarehi et al. | 118/723 ME |
| 7,226,524 B2 * | 6/2007 | Kasai et al. | 156/345.36 |
| 7,304,438 B2 | 12/2007 | Kishinevsky | |
| 2001/0026575 A1* | 10/2001 | Sato et al. | 373/18 |
| 2002/0112819 A1* | 8/2002 | Kamarehi et al. | 156/345.36 |
| 2005/0034815 A1 | 2/2005 | Kasai et al. | |
| 2007/0176709 A1 | 8/2007 | Oksuz et al. | |
| 2009/0065480 A1* | 3/2009 | Ohmi et al. | 216/69 |

FOREIGN PATENT DOCUMENTS

| | | | |
|---|---|---|---|
| GB | 2459461 | | 10/2009 |
| JP | 6231711 | | 8/1991 |
| JP | 2007-048718 | * | 2/2007 |
| WO | WO03/052807 | * | 6/2003 |

OTHER PUBLICATIONS

Notification of Transmittal of the International Search Reoprt and the Written Opinion of the International Searching Authority for PCT/US2010/002972 filed Nov. 12, 2010; 12 pages.

* cited by examiner

*Primary Examiner* — Rakesh Dhingra (57) ABSTRACT

A continuously variable microwave circuit capable of being tuned to operate under a plurality of distinct operating conditions, comprising: a waveguide comprising an adjustable tuning element having a core configured to protrude into the waveguide; an actuator in operative communication with the adjustable tuning element, wherein the actuator is operable to selectively vary a length of the core that is protruding into the waveguide so as to minimize reflected microwave power in the plasma asher; and a controller in operative communication with the actuator, wherein the controller is configured to selectively activate the actuator upon a change in the plurality of operating conditions.

15 Claims, 3 Drawing Sheets

TUNING HARDWARE FOR PLASMA ASHING APPARATUS AND METHODS OF USE THEREOF

BACKGROUND OF THE INVENTION

The present disclosure generally relates to plasma ashing apparatus, and more particularly to tuning hardware for plasma ashing apparatus and methods of using the hardware.

Radio frequency or microwave ("microwave") plasma generation equipment is widely used in semiconductor and industrial plasma processing. Plasma processing supports a wide variety of applications, including etching of materials from a substrate or workpiece, deposition of materials onto a substrate, cleaning a workpiece surface, and modification of a substrate surface. In a plasma discharge device, a gas is flowed through a plasma tube located in a microwave cavity, and a plasma is excited in the gas by microwave energy. This plasma, or the afterglow therefrom, is typically directed to a process chamber where the substrate or workpiece resides and is used to remove or deposit material from or onto the substrate.

One mechanism to generate a microwave plasma includes a waveguide having a magnetron launcher on one end, and an applicator at the other end with a plasma gas tube running through the waveguide. A microwave field is generated in this section of the waveguide, such that the electrical energy couples to the gas in the applicator to produce a plasma therein. This plasma comprises among other charged species, excited gas atoms and molecules creating a high energy reactive state. The amount of microwave power coupled into the plasma load can vary significantly, and is typically a function of the plasma conditions such as chamber pressure, gas composition and gas flow, as well as the mechanism of impinging electric fields on the plasma load. These conditions, and therefore microwave power absorption by the plasma as well as reflected microwave power, can vary as a function of time while a workpiece is being processed by the plasma. Hence, the plasma can be a highly variable load for the microwave energy coupled to the plasma. Precautions must be taken to counteract the variability of microwave energy absorption by the plasma should any of the above mentioned conditions change. Otherwise, the microwave-excited plasma is likely to be quite inconsistent and variable with regard to a number of parameters (particularly species flux density) as a function of time and space that can have a deleterious effect on the substrate. Maximizing the power transfer from the supply to the plasma load is known as tuning the microwave circuit, and may be accomplished by changing the size and position of tuning stubs or the location of a sliding short, and other similar mechanisms.

A disadvantage associated with many plasma discharge devices designed for material removal, such as removal of photoresist—also known as ashing, is that they are designed for use with only a single type of gas, e.g., oxygen, fluorine-containing gas, or a small set of gas mixtures. Current plasma source ashing systems typically operate with a so-called "fixed-tune" system or network. The system can be adjusted prior to initialization or during startup of the plasma ash tool in order to optimize plasma conditions, but once startup is completed, the plasma source operates within the prescribed process window (e.g., for the desired gas compositions, flow rate, pressure, and the like) without any requirement of additional tuning However, when a process using a different processing condition such as gas type, gas composition, chamber pressure, etc. is to be performed, the energy coupling hardware must be changed, and a new piece of equipment must be used, resulting in sometimes unacceptable costs for particular manufacturing processes.

Fixed-tune networks, therefore, fail to minimize reflected power once a prescribed operating window is breached. As mentioned previously, the microwave excited plasma may absorb significantly different amounts of microwave energy as a function of plasma conditions, such as gas composition, gas pressure, and the like. Specifically, if a new process gas, gas mixture, or gas pressure is required for optimal processing of the substrate, the reflected power may no longer be minimized by the fixed tune network. This can lead to significant stability control problems for the plasma generation equipment. In such a case, additional tuning of the tuning stub(s) and/or sliding short is required in order to reduce reflected power, which would allow maximum power transfer to the new plasma load brought on by the change in gas composition. On a typical fixed-tune system, this adjustment can only be done by utilizing a different plasma ash tool dedicated to the new gas chemistry and/or pressure. This is a particularly egregious problem when the change in gas composition or pressure is simply for one step in a multi-step process. Using a different plasma ash tool, or stopping the process to tune the existing plasma ash tool, can be time consuming, cost prohibitive, and in some cases, impossible.

The problems associated with fixed tune systems have been recognized in semiconductor and industrial plasma processing industry for quite some time, as demonstrated by commonly assigned U.S. Pat. No. 6,057,645, which discloses a plasma discharge device that may be used with different fill gases over a wide range of process conditions. This is accomplished by providing a device which is broadly tunable, so that an appropriate resonant microwave mode may be achieved even when different gases and different operating conditions are present. The invention of that patent provides dynamic tuning by defining at least one end of a longitudinally extending microwave cavity with a microwave trap, and arranging for the longitudinal position of the microwave trap to be adjustable. In accordance with a further aspect of that patent, the microwave power is coupled to the cavity with an antenna which extends into the cavity, the degree of insertion of which into the cavity is adjustable to provide a further tuning adjustment, so that coupling of the desired resonant microwave mode may be enhanced while the operating window is enlarged.

Thus, it can be seen that tuning hardware has been integrated into microwave plasma ashing apparatus in order to optimize microwave energy into the plasma load. However, this type of tuning, known in the art as "internal tuning" can be cost prohibitive. One simple embodiment of such tuning hardware that can be adjusted to optimize the coupling of microwave energy into the plasma load, and to enable a plasma discharge device to be used over a wide range of process conditions is a stub tuner, which can be repositioned or resized to limit the amount of power reflected back to the source from the plasma load. This type of tuning mechanism, known typically as "external tuning" is significantly simpler and less expensive than the internal tuners. To that end, one or more pieces of tuning hardware can form a tuning network configured to transform the impedance of the plasma load to an impedance substantially equal to the impedance of the microwave source with reference to an output port of the microwave source into the tuning network. Specifically, a tuning stub can be used to minimize reflected power from the plasma applicator, and an adjustable tuning stub can enable the use of varying gas chemistries, mixtures, pressures, and the like within a single plasma ashing apparatus and reduce costs for particular manufacturing processes.

Based on the foregoing, what is needed in the art is economical adjustable tuning hardware for a plasma ashing apparatus that enables use of varying gas chemistries, mixtures, pressures, and the like within a single apparatus. In particular, a plasma ashing system can be outfitted with an adjustable tuning stub for selectively reducing reflected power from the process chamber, and enable the use of varying gas chemistries, mixtures, pressures, and the like within a single plasma ashing apparatus and reduce costs for particular manufacturing processes.

BRIEF SUMMARY OF THE INVENTION

Disclosed herein are processes and apparatuses configured to minimize reflected power in a plasma ashing apparatus that use two or more plasma loads that differ from each other, for example by a change in gas composition, independently.

In one embodiment, a continuously variable microwave circuit capable of being tuned to operate under a plurality of distinct operating conditions includes an adjustable tuning element having a core configured to protrude into the waveguide; an actuator in operative communication with the adjustable tuning element, wherein the actuator is operable to selectively vary a length of the core that is protruding into the waveguide so as to minimize reflected microwave power; and a controller in operative communication with the actuator, wherein the controller is configured to selectively activate the actuator upon a change in the plurality of operating conditions.

In another embodiment, a tunable plasma ashing apparatus for stripping photoresist, polymers, and/or residues from a substrate includes a plasma generating component for generating a plasma, comprising a microwave power source; a continuously variable microwave circuit capable of being tuned to operate under a plurality of operating conditions in operative communication with the microwave power source, wherein the circuit comprises: a waveguide in operative communication with the microwave power source configured to transmit microwave energy therethrough; an adjustable tuning element in operative communication with the waveguide, wherein the adjustable tuning element comprises a core configured to protrude into the waveguide; an actuator in operative communication with the tuning element, wherein the actuator is operable to selectively vary a length of the core that is protruding into the waveguide so as to minimize reflected microwave power in the plasma asher; a process chamber in fluid communication with the waveguide for housing the substrate an delivering microwave power thereto; and a controller in operative communication with the actuator, wherein the controller is configured to selectively activate the actuator upon a change in the plurality of operating conditions.

A plasma ashing process includes generating microwave energy in a waveguide; forming a first plasma from a first gas composition with the microwave energy; minimizing reflected power from the first plasma by adjustably inserting a tuning stub core into the waveguide at a first insertion length; forming a second plasma from a second gas composition with the microwave energy; and selectively varying a length of the tuning stub core inserted into the waveguide to minimize reflected power from the second plasma by contemporaneously moving the adjustable tuning stub core from the first insertion length to a second insertion length when the second plasma is formed.

These and other features and advantages of the embodiments of the invention will be more fully understood from the following detailed description of the invention taken together with the accompanying drawings. It is noted that the scope of the claims is defined by the recitations therein and not by the specific discussion of features and advantages set forth in the present description.

BRIEF DESCRIPTION OF THE DRAWINGS

The following detailed description of the embodiments of the invention can be best understood when read in conjunction with the following figures, which are exemplary embodiments, in which.

Skilled artisans will appreciate that elements in the figures are illustrated for simplicity and clarity and have not necessarily been drawn to scale.

DETAILED DESCRIPTION OF THE INVENTION

Disclosed herein is tuning hardware configured to enable the use of at least two different plasma loads (such as would be expected for different gas compositions) in a single plasma ashing apparatus. Specifically disclosed herein is a continuously variable microwave circuit capable of being tuned to operate under a plurality of distinct operating conditions. The continuously variable microwave circuit includes a waveguide comprising an adjustable tuning stub having a core configured to protrude into the waveguide; an actuator in operative communication with the tuning stub, wherein the actuator is operable to selectively vary a length of the core that is protruding into the waveguide so as to minimize reflected microwave power in the plasma asher; and a controller in operative communication with the actuator, wherein the controller is configured to selectively activate the actuator upon a change in the plurality of operating conditions. Selectively varying the length of protrusion of the adjustable tuning stub core into the waveguide (horizontal motion), while simultaneously having the ability to continuously vary the position of the tuning stub core over a given length of the waveguide (vertical motion) is effective in minimizing reflected power for a variety of different operating conditions (e.g., gas compositions). The continuously variable microwave circuit, therefore, eliminates the need for separate plasma ash tools to run different operating conditions. It also eliminates the need to stop in the middle of the process and adjust tuning hardware when only a single plasma ash tool is available, but multiple operating conditions, such as gas chemistries, are required for the process. In other words, the continuously variable microwave circuit disclosed herein permits the use of multiple operating conditions in a single plasma ashing apparatus, thereby saving time, capital costs, operating costs, and improving system efficiency.

For ease in discussion and illustration, the continuously variable microwave circuit disclosed herein is described with reference to its use in a dual-chemistry plasma ashing process. In other words, the continuously variable microwave circuit is discussed as it would be used in a single plasma ash tool operating with two different plasma loads, such as might be expected with two different gas compositions during the ashing process. It is to be understood, however, that the continuously variable microwave circuit can be employed in any plasma ashing apparatus that utilizes a plurality of operating conditions. The plurality of operating conditions can include, without limitation, different total gas flows, discrete gas compositions, different gas pressures, different microwave power input, a combination thereof, and the like. For example, some current plasma ashing processes utilize both standard gas compositions and non-standard gas compositions in the plasma ashing process. While standard gas compositions can include, without limitation, oxygen-, nitrogen-, hydrogen-, fluorine-, and the like-containing gases, a new gas composition being used in plasma ashing is nitrous oxide (N2O). This non-standard gas composition can be used in lieu of, or in conjunction with, the standard gas chemistries in one or more steps of the plasma ashing process. Therefore, in one embodiment, the continuously variable microwave circuit is disposed in a plasma ash tool that utilizes a process recipe consisting of both a standard gas composition and N2O gas in separate process steps. To reiterate, however, it is to be understood that the continuously variable microwave circuit described herein can be configured to automatically adjust to multiple positions (i.e., more than two) for minimizing reflected power from multiple operating conditions that may be used in the ashing process of a single plasma ash tool.

The continuously variable microwave circuit can be disposed in plasma ashing apparatus (i.e., plasma ashers) that include a plasma source and a processing chamber. As briefly noted above, the disclosure is not intended to be limited to any particular plasma ashing apparatus. Plasma ashing apparatus particularly suitable for practicing the present disclosure are downstream plasma ashers, such as, for example, those microwave plasma ashers available under the trade name Axcelis RapidStrip 320® or Integra RS®, which are commercially available from Axcelis Technologies, Inc. in Beverly, Mass. Other examples of plasma generating and discharge apparatus that can be utilized according to the present disclosure include ash tools employing radio frequency (RF) energy to generate plasma.

Figure 1:
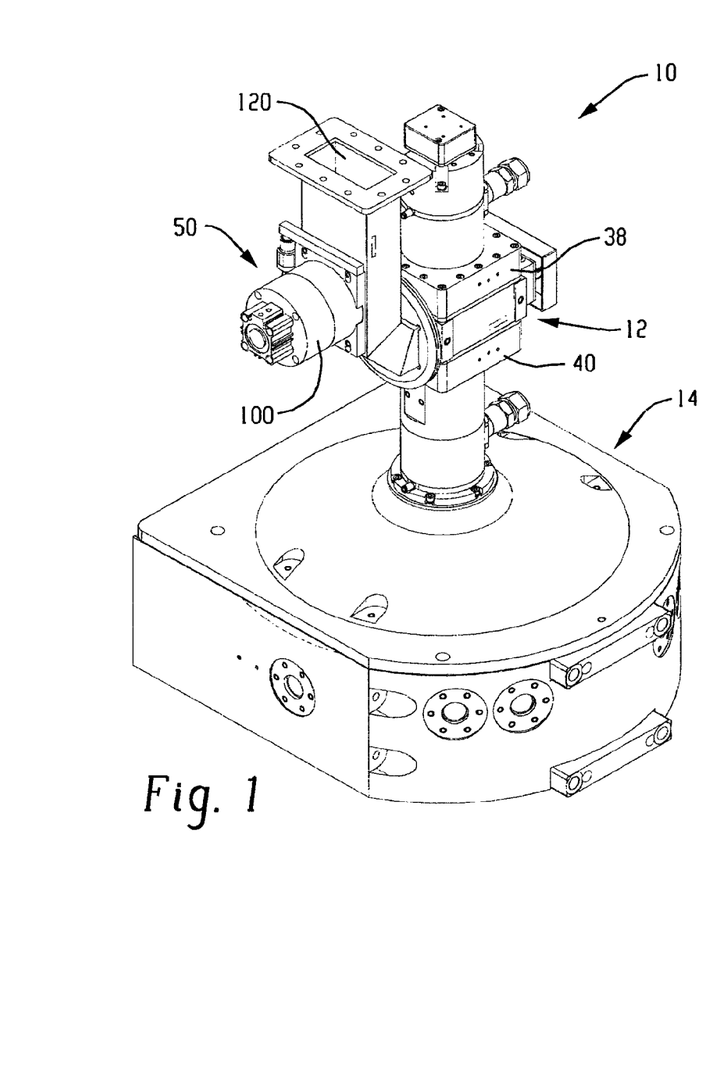
FIG. 1 schematically illustrates an embodiment of a plasma ashing apparatus.
Figure 2:
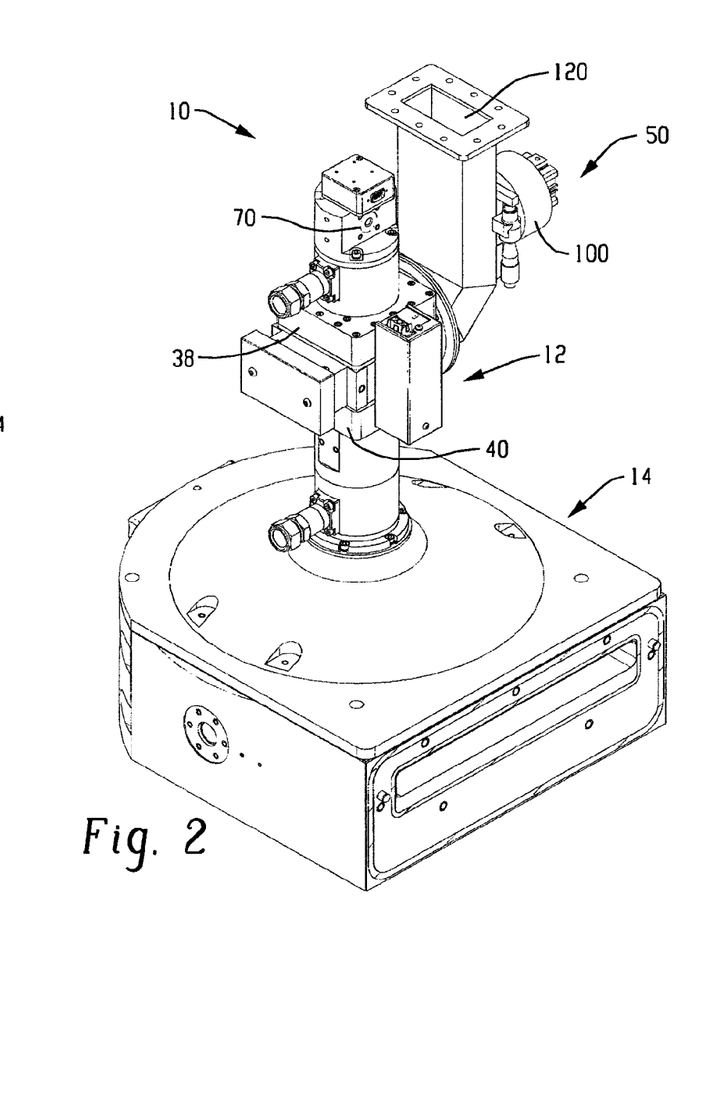
FIG. 2 schematically illustrates another view of the plasma ashing apparatus of FIG. 1.

Referring now to FIGS. 1 and 2, an exemplary plasma ashing apparatus generally designated 10 is illustrated. The plasma ashing apparatus 10 generally comprises a microwave plasma-generating component 12 and a process chamber 14. The plasma-generating component has a plasma tube passing therethrough. The plasma tube is fed with microwave energy during operation. Microwave traps 38 and 40 are provided at the ends of the microwave plasma-generating component 12 to prevent microwave transmission.

A gas inlet 70 is in fluid communication with the plasma tube that is supported at this end by an O-ring in an end cap. The other end of the plasma tube is passes through the microwave trap 40 and has an opening for emitting plasma afterglow/gas into the process chamber 14. Optionally, the conduit forming the opening is fitted with a narrow aperture fitting to create a pressure differential between the plasma tube and the processing chamber 14, wherein the pressure is greater in the plasma tube. During operation, the pressure within the plasma tube preferably is about 1 torr to about atmospheric pressure (about 760 ton). In contrast, the pressure within the process chamber 14 during operation is about 100 millitorr to about atmospheric pressure (760 ton).

The opening of the plasma tube is in fluid communication with an interior region of the process chamber 14. Since the plasma is discharged from a relatively narrow orifice (compared to the dimensions of the substrate to be processed) into the interior of the process chamber 14, a gas distribution system (not shown) to promote uniform plasma exposure onto the substrate is disposed within the process chamber 14. The gas distribution system is disposed intermediate to the substrate and opening of the plasma tube.

Microwave power provided by, for example, a magnetron is fed through a waveguide 120 having a substantially perpendicular configuration. The length of the waveguide 120 can vary. The waveguide 120 is coupled to the microwave-plasma generating component 12, through which the plasma tube extends; thus plasma can be excited in a gas mixture flowing through the plasma tube. The waveguide 120 is a component of the continuously variable microwave circuit 100. The continuously variable microwave circuit 100 further includes an adjustable tuning stub disposed in the waveguide 120. The plasma ashing apparatus 10 can further include additional tuning hardware, such as a sliding short, disposed at an end of the waveguide section. The need for additional tuning hardware will be easily determined by those having skill in the art, and will depend in part upon the desired process conditions, such as gas compositions, mixtures, pressures, flow rate, input power, and the like.

Figure 3:
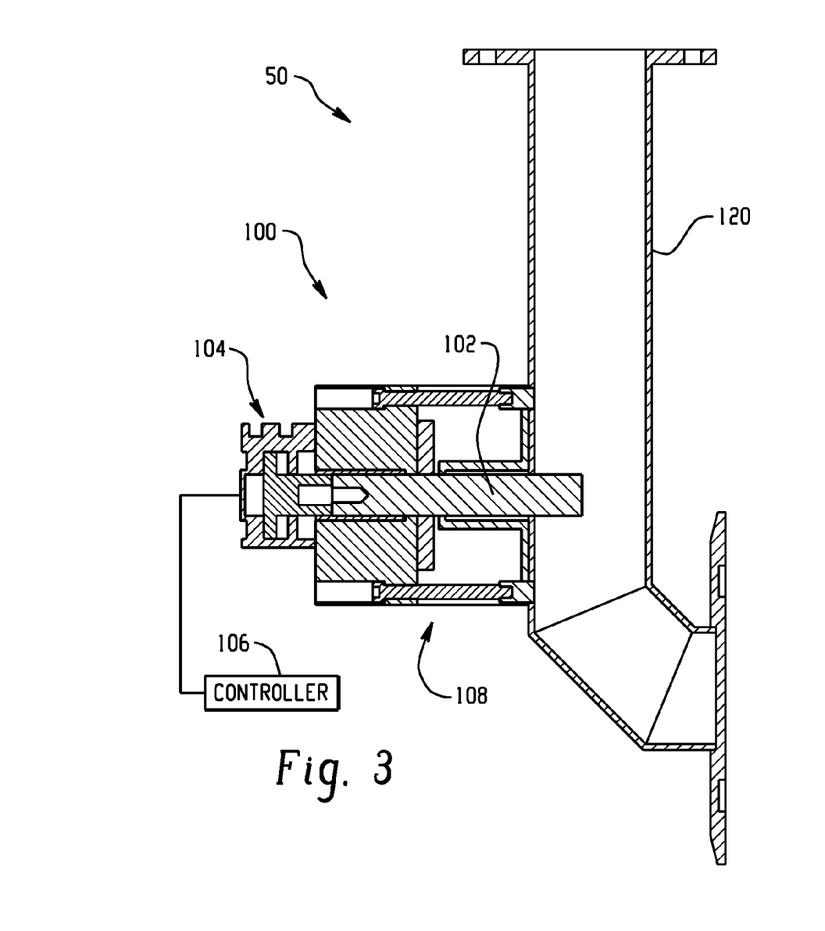
FIG. 3 schematically illustrates an exemplary embodiment of a continuously variable microwave circuit, wherein the adjustable tuning stub includes a microwave trap.
Figure 4:
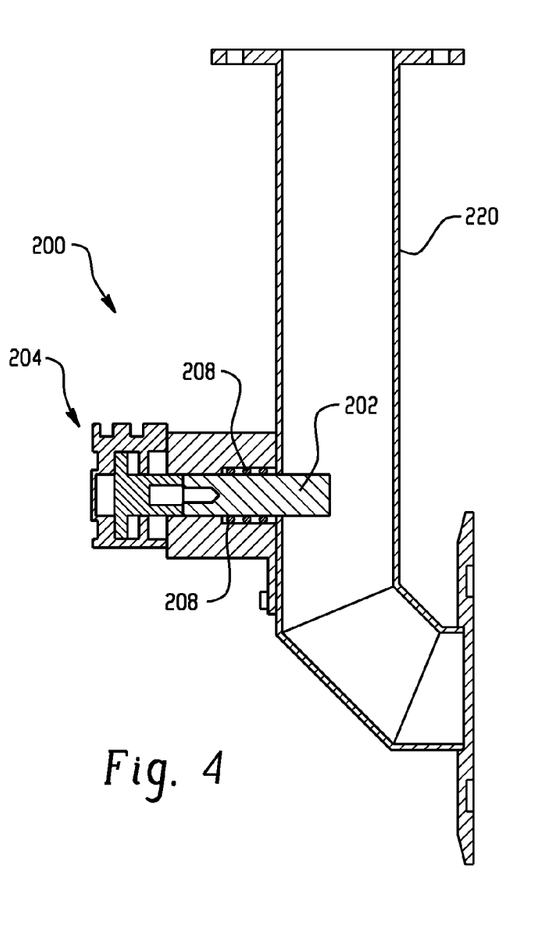
FIG. 4 schematically illustrates an exemplary embodiment of a continuously variable microwave circuit, wherein the adjustable tuning stub includes copper bearings.

Referring now to FIGS. 3 and 4, exemplary embodiments of the continuously variable microwave circuit are schematically illustrated. In FIG. 3, the continuously variable microwave circuit 50 illustrates an adjustable tuning stub 100 in operative communication with microwave waveguide 120. The adjustable tuning element 100 includes a core, also known as a stub 102 configured to protrude into the waveguide 120 by a variably selected distance (i.e., length) depending upon one or more distinct operating conditions. The core 102 is adjustable to a plurality of positions that selectively place a complex reactance into the waveguide 120. The core is comprised of an electrically conductive material, such as copper or aluminum. In one embodiment, the core 102 has a cylindrical shape.

The continuously variable microwave circuit 50 further includes an actuator 104 in operative communication with the adjustable tuning element 100. The actuator 104 is configured to move the core 102 from, in the example of a dual-chemistry apparatus, a first position to a second position, wherein the change in position to from the first to a second corresponds to the adjustment necessary to minimize reflected power in the plasma asher as a result of a change in the discrete operating conditions. The change from first position to second position will change the depth to which the core 102 extends into the waveguide 120 interior. In one embodiment, the actuator 104 is pneumatically operated, wherein a pressurized gas effectuates movement of the core 102. In another embodiment, the actuator 104 can be electrically operated. In either actuator type, a controller 106 can be in electrical communication with the actuator and configured to power on/off the actuator 104 based on one or more predetermined operating conditions. For example, as a plasma ashing apparatus switches from a first gas composition to a second gas composition, the controller 106 can activate the actuator 104 to move the core 102 from a first position to a second position. The relative positions, of course, are predetermined based for the different gas compositions to be used in the apparatus and are configured to minimize reflected power therein.

A microwave trap 108 surrounds the core 102 and is configured to prevent leakage of microwave energy from the waveguide 120. The microwave trap 108 is in operative communication with the core 102 of the adjustable tuning element 100 and electrically isolates the core 102 from the waveguide 120. Microwave traps are well known to those having skill in the art and any trap suitable for preventing microwave transmission from the adjustable tuning element 100 can be used.

In another exemplary embodiment of the continuously variable microwave circuit, a microwave trap is not used and the core 202 of the adjustable tuning element 200 is in intimate electrical contact with the waveguide 220. FIG. 4 schematically illustrates an embodiment of the adjustable tuning element 200 in intimate electrical and operative communication with the waveguide 220. The adjustable tuning element 200 includes the core, also known as a stub, 202 configured to selectively impinge into the waveguide 220. Like the previous embodiment, the core 202 is adjustable to a plurality of positions to selectively place a complex reactance into the waveguide 220. Likewise, the adjustable tuning element 200 further includes an actuator 204 in operative communication with the core 202, wherein the actuator 204 is configured to move the core 202 to a position effective to minimize reflected microwave power in the plasma asher. The movement of the core 202 being necessary, of course, as a result of the change in a plurality of distinct operating conditions that occurred within the apparatus. However, rather than isolating core 202 from the microwave energy of the waveguide 220 with a microwave trap as illustrated by the embodiment of FIG. 3, the adjustable tuning element 200 utilizes metal or metal alloy bearings 208 to ground any microwave leakage between the core 202 and waveguide 220. Again, the bearings 220 allow the core to be in intimate electrical contact with the waveguide and prevent the need for a microwave trap. In an exemplary embodiment, the bearings 208 as well as the core 202 are beryllium copper. In another embodiment, the bearings 208 are a different metal or metal alloy capable of grounding any microwave leakage from the adjustable tuning element 200.

In operation, data is collected over the desired plasma sources (i.e., gas compositions, pressures, etc.) to determine the optimal location and insertion length of the adjustable tuning element and additional optional tuning hardware (e.g., sliding short) for each plasma load. Once established, the sliding short position and location of the adjustable tuning element can be locked into place. As used herein, "location" of the tuning stub is intended to refer to the position of the stub along the longitudinal axis of the waveguide. Insertion length (i.e., along the horizontal axis) of the core is the adjustable feature of the tuning stub utilized as the plasma ashing process is in progress. The insertion length, or length the core extends into the waveguide, is set for each different gas composition being used in the process and the controller and actuator are configured so as to change the insertion length of the core into (or out of) the waveguide upon a change in distinct operating conditions, such as gas composition in the plasma ashing apparatus. For example, in a process that utilizes two different gas compositions or gas mixtures, the actuator is configured to move the core of the tuning stub from a first position, whose insertion length has been predetermined for the first gas composition/mixture to a second position, whose insertion length has been predetermined for the second gas composition/mixture. As mentioned previously, the insertion lengths and location of the adjustable tuning element are configured to minimize reflected power by matching the impedance of the plasma to the impedance of the microwave energy.

Again, it is to be understood that the continuously variable microwave circuit as described herein can be used in any microwave energized plasma ashing apparatus that uses two or more gas compositions that produce different plasma load impedances, thereby requiring an adjustment of the tuning hardware. Exemplary gas compositions and mixtures can include, without limitation, nitrogen containing gases, fluorine bearing gases, reducing gases, oxidizing gases, inert gases, and the like. Exemplary nitrogen containing cases include, without limitation, $N_2$, $N_2O$, $NO$, $N_2O_3$, $NH_3$, $NF_3$, $N_2F_4$, $C_2N_2$, $HCN$, $NOCl$, $ClCN$, $(CH_3)_2NH$, $(CH_3)NH_2$, $(CH_3)_3N$, $C_2H_5NH_2$, mixtures, thereof, and the like.

Exemplary fluorine bearing gases include those gaseous compounds that generate fluorine reactive species when excited by the plasma. In one embodiment, the fluorine gaseous compound is a gas at plasma forming conditions and is selected from the group consisting of a compound having the general formula $C_xH_yF_z$, wherein x is an integer from 0 to 4 and y is an integer from 0 to 9 and z is an integer from 1 to 9 with the proviso that when x=0 then y and z are both are equal to 1, and when y is 0 then x is 1 to 4 and z is 1 to 9; or combinations thereof. Alternatively, the fluorine bearing gas is $F_2$, $SF_6$, and mixtures thereof including, if desired, the fluorine bearing gases defined by the general formula $C_xH_yF_z$ above.

The fluorine-bearing gases, when exposed to the plasma, can occupy any percentage of the total volume of the plasma gas mixture to maximize selectivity. In one embodiment, the fluorine-bearing compounds, when exposed to the plasma, may consist of 100 percent of the total volume of the plasma gas mixture, with no other gases present in the mixture. In another embodiment, the fluorine-bearing compounds, when exposed to the plasma, are less than about 5 percent of the total volume of the plasma gas mixture.

Exemplary reducing gases include, without limitation, hydrogen bearing gases such as $H_2$, $CH_4$, $NH_3$, $C_xH_y$, wherein x is an integer from 1 to 3 and y is an integer from 1 to 6, and combinations thereof. The hydrogen bearing compounds used are ones that generate sufficient atomic hydrogen species to increase removal selectivity of the polymers formed during etching and etch residues. Particularly preferred hydrogen bearing compounds are those that exist in a gaseous state and release hydrogen to form atomic hydrogen species such as free radical or hydrogen ions under plasma forming conditions. The hydrocarbon based hydrogen bearing compounds gas may be partially substituted with a halogen such as bromine, chlorine, or fluorine, or with oxygen, nitrogen, hydroxyl and amine groups.

The hydrogen gas ($H_2$) is preferably in the form of a gas mixture. In one embodiment, the hydrogen gas mixtures are those gases that contain hydrogen gas and an inert gas. Examples of inert gases include argon, nitrogen, neon, helium and the like. Particularly exemplary hydrogen gas mixtures are so-called forming gases, such as nitrogen-forming-gas that consist essentially of 3% to 5% hydrogen gas and the remainder nitrogen gas.

Exemplary oxidizing gases include, without limitation, $O_2$, $O_3$, $CO$, $CO_2$, $H_2O$, and the like. When using oxidizing gases, it is generally preferred to remove any O+ and O− species from the plasma prior to exposure to the substrate. It has been found that a causal factor of substrate oxidation is the reaction of the substrate with O*, O+ and O⁻ species. Additionally, the diffusion of these species can be enhanced by electric fields present or induced in the surface oxide. Because of this, a strategy for minimizing oxide growth should address both issues, namely: suppress O* and O− formation, and reduce or eliminate electric fields and oxide charging. Removal can be effected by increasing pressure within the reaction chamber during plasma processing, the addition of additives, addition of gases that contain both nitrogen and oxygen elements (.e.g., nitric oxide), and the use of filters, e.g., atomic and ionic filters.

Exemplary inert gases for addition to the gas mixture include, without limitation, helium, argon, nitrogen, krypton, xenon, neon, and the like.

In a particular embodiment, the continuously variable microwave circuit 50 and plasma ashing apparatus 10 utilizes a one or more gas composition having standard gas chemistry and at least one additional gas composition comprised of N2O. One or more of the standard gas compositions can be satisfied with a single vertical location and insertion length of the adjustable tuning element. However, it has been determined that the N2O will require at least one additional adjustable tuning element location and protrusion/insertion core length. As used herein, "standard" gas chemistries are disclosed above and typically include compositions composed of varying mixtures of oxygen, nitrogen-forming gas, $CF_4$, ammonia, helium-forming gas, and the like. These gases, for example, generally only require one size and location of adjustable tuning element to optimize microwave coupling regardless of the mixture thereof. However, when the use of a non-standard gas composition is desired, i.e., those chemistries not mentioned above, such as N2O, the plasma load is sufficiently different so as to generate high reflected power with the standard tuning stub location and length of protrusion into the waveguide. For example, it has been found by the inventors hereof that running N2O in a plasma system with tuning stub and sliding short positions tuned for the standard gas compositions lead to unacceptably high reflected power. The continuously variable microwave circuit, therefore, is necessary when the ashing process calls for the use of N2O gas in lieu of, or in conjunction with these standard gas compositions. The N2O gas requires a shorter insertion length of the tuning stub core into the waveguide than is required by the standard gas compositions. The continuously variable microwave circuit tuning stub, therefore, can be configured to actuate a retraction of the core in the adjustable tuning element from a first position to a second position of shorter insertion length when the plasma ashing process converts from standard gas composition to N2O gas composition, in order to continue optimal power transfer by minimizing reflected power.

In one embodiment, a pneumatic actuator may be used to achieve the two positions of the tuning stub. In operation, when the N2O is being processed, the compressed dry air (CDA) used to trigger the N2O mass-flow-controller can trigger the actuator of the dual-position tuning stub to retract the core. During all other processes (i.e., during use of all other standard chemistries), the CDA from the gas mixtures will trigger the actuator to extend the core to the predetermined position further in the waveguide.

As discussed, the continuously variable microwave circuit can be practiced in conventional plasma ashing systems. Moreover, the adjustable tuning element, actuator, and controller of the continuously variable microwave circuit can advantageously be retrofitted on existing waveguides without significant modification. The invention is not intended to be limited to any particular hardware for plasma ashing. The settings and optimization for the continuously variable microwave circuit will depend upon the particular plasma applicators and ashers chosen and will be well within the skill of those in the art in view of this disclosure.

Figure 5:
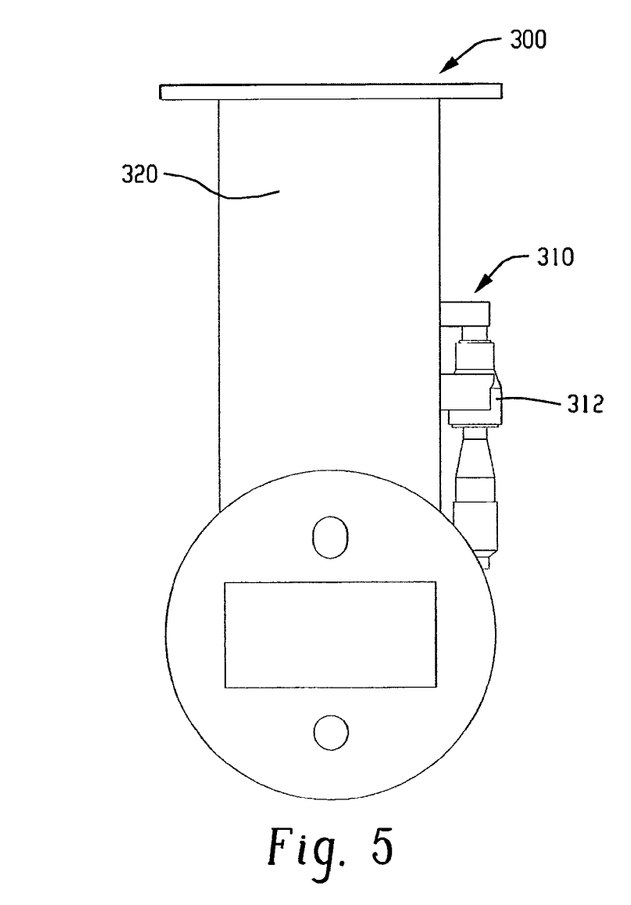
FIG. 5 schematically illustrates an exemplary embodiment of a continuously variable microwave circuit comprising a vertical positioning system.
Figure 6:
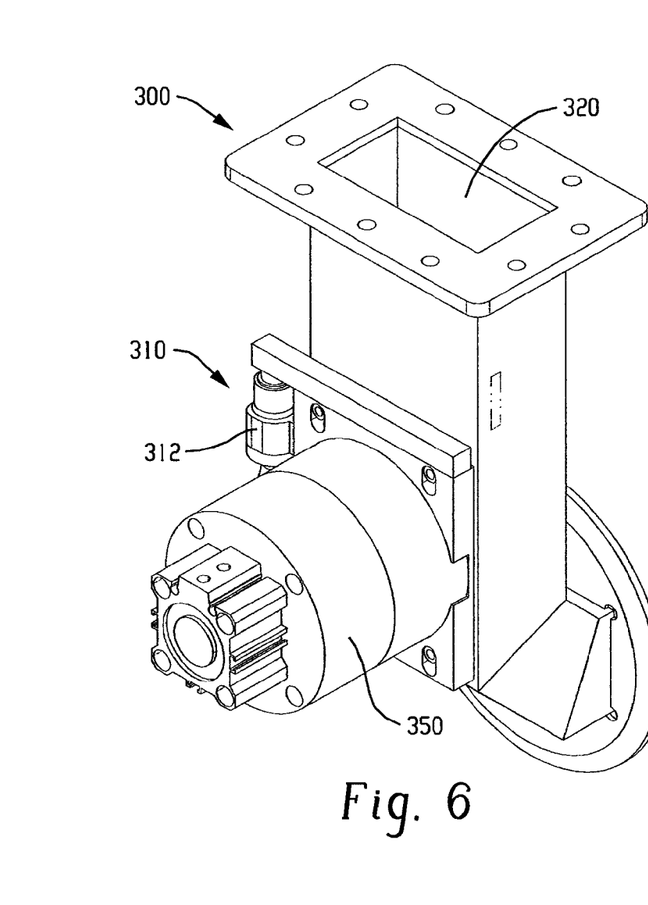
FIG. 6 schematically illustrates another view of the continuously variable microwave circuit of FIG. 5, including the vertical positioning system.

In an exemplary embodiment, the continuously variable microwave circuit can also be configured to have vertical position adjustability along with the insertion length adjustability discussed above. The requirement for locating the stub vertically in the waveguide may vary from tool-to-tool, but can be selectively varied in the vertical position (i.e., along the length of the waveguide) so as to, for example, maximize power transfer. FIGS. 5 and 6 schematically illustrate a continuously variable microwave circuit 300 comprising a vertical positioning system 310. The vertical positioning system 310 includes a means for selectively varying a position of the adjustable tuning element 350 along a length of the microwave waveguide 320 to further provide a capability for operating under the plurality of operating conditions. The vertical positioning system 310 provides an additional degree of freedom to the continuously variable microwave circuit, thereby further increasing the process flexibility of the plasma asher in which the circuit is disposed. The means for selectively varying a position of the adjustable tuning element 350 can include any mechanism capable of moving the adjustable tuning element 350 in a vertical position up or down along the length of the waveguide 320. For example, in one embodiment the vertical positioning system can comprise a micrometer 312 disposed on the waveguide 320 and in operative communication with the adjustable tuning element 350. In another embodiment, the vertical positioning system 310 can further include a vertical actuator in operative communication with the adjustable tuning element, and more specifically the micrometer 312, wherein the actuator is operable to selectively position the adjustable tuning element along the length of the microwave waveguide 320 so as to minimize reflected microwave power. The vertical positioning system 310 can also include a controller in operative communication with the vertical actuator, wherein the controller is configured to selectively activate the vertical actuator upon a change in the plurality of operating conditions. A continuously variable microwave circuit that includes both the adjustable tuning element and the vertical positioning system provides continuous adjustability in both vertical and horizontal (i.e., insertion length) directions, thereby enabling a plasma asher to be suitable for a wider variety of process conditions than current tuning hardware can provide an asher.

The continuously variable microwave circuit can be used in any plasma mediated ashing process to effectively ash, i.e., remove, photoresist, ion implanted photoresist, polymers, and/or post etch residues from a semiconductor substrate with minimal substrate loss. Additionally, similar tuning hardware can be used for plasma based deposition on a substrate. Advantageously, the continuously variable microwave circuit permits a plasma ashing apparatus to use various gas compositions and mixtures in a continuous process. Moreover, the continuously variable microwave circuit prevents the need for an additional plasma ash tool specially designed for changes in gas composition that may occur in one or more steps of the process.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the embodiments of the invention belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

While embodiments of the invention have been described with reference to exemplary embodiments, it will be understood by those skilled in the art that various changes can be made and equivalents can be substituted for elements thereof without departing from the scope of the embodiments of the invention. In addition, many modifications can be made to adapt a particular situation or material to the teachings of embodiments of the invention without departing from the essential scope thereof. Therefore, it is intended that the embodiments of the invention not be limited to the particular embodiment disclosed as the best mode contemplated for carrying out this invention, but that the embodiments of the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A variable microwave circuit capable of being tuned to operate under a plurality of operating conditions in a plasma ashing apparatus, comprising:
    a waveguide comprising an adjustable tuning element having a core configured to protrude into the waveguide,
    wherein the adjustable tuning element comprises a plurality of bearings arranged between the core and the waveguide, and wherein a portion of the core external to the waveguide is grounded, via electrical contact with the plurality of bearings such that microwave leakage between the waveguide and the core is grounded;
    an actuator to selectively vary a length of the core of the adjustable tuning element that is protruding into the waveguide; and
    a controller configured to selectively adjust the actuator upon a change in the plurality of operating conditions in the plasma ashing apparatus.

2. The microwave circuit of claim 1, wherein the actuator is pneumatic or electrical.

3. The microwave circuit of claim 1, wherein the plurality of operating conditions comprises discrete gas compositions, different gas pressures, different microwave power inputs, or a combination comprising at least one of the foregoing.

4. The microwave circuit of claim 3, wherein the discrete gas compositions comprise nitrogen containing gases, fluorine bearing gases, reducing gases, oxidizing gases, inert gases, or a combination comprising at least one of the foregoing.

5. The microwave circuit of claim 1, further comprising a vertical positioning system for selectively varying a position of the adjustable tuning element along a length of the waveguide.

6. The microwave circuit of claim 5, wherein the vertical positioning system comprises:
    a vertical actuator to selectively position the adjustable tuning element along the length of the waveguide; and
    a controller configured to selectively activate the vertical actuator upon a change in the plurality of operating conditions.

7. A plasma ashing apparatus including the microwave circuit of claim 1.

8. The variable microwave circuit of claim 1, wherein the circuit is disposed within a microwave downstream plasma ashing apparatus.

9. A tunable plasma ashing apparatus for stripping photoresist, polymers, and/or residues from a substrate, comprising:
    a plasma generating component configured to generate plasma and comprising a microwave power source;
        a variable microwave circuit capable of being tuned to operate under a plurality of operating conditions, wherein the variable microwave circuit comprises:
        a waveguide in operative communication with the microwave power source configured to transmit microwave energy therethrough;
        an adjustable tuning element comprising a core configured to protrude into the waveguide,
        wherein the core comprises a plurality of bearings arranged between the core and the waveguide,
        wherein the bearings comprise metal or metal alloy, and
        wherein the plurality of bearings are disposed outside of the waveguide;
        an actuator to selectively vary a length of the core of the adjustable tuning element that is protruding into the waveguide;
        a controller configured to selectively adjust the actuator upon a change in the plurality of operating conditions; and
    a process chamber for housing the substrate in fluid communication with the plasma generating component.

10. The tunable plasma ashing apparatus of claim 9, wherein a selected one or both of the plurality of bearings and the core comprise beryllium copper.

11. The tunable plasma ashing apparatus of claim 9, wherein the actuator is pneumatic or electrical.

12. The tunable plasma ashing apparatus of claim 9, wherein the plurality of operating conditions comprises different total gas flows, discrete gas compositions, different gas pressures, different microwave power inputs, or a combination comprising at least one of the foregoing.

13. The tunable plasma ashing apparatus of claim 12, wherein the discrete gas compositions comprise nitrogen containing gases, fluorine bearing gases, reducing gases, oxidizing gases, inert gases, or a combination comprising at least one of the foregoing.

14. The tunable plasma ashing apparatus of claim 9, further comprising a vertical positioning system configured to selectively vary a position of the adjustable tuning element along a length of the waveguide.

15. The tunable plasma ashing apparatus of claim 14, wherein the vertical positioning system comprises:
    a vertical actuator to selectively position the adjustable tuning element along the length of the waveguide; and
    a controller configured to selectively activate the vertical actuator upon a change in the plurality of operating conditions.

* * * * *

UNITED STATES PATENT AND TRADEMARK OFFICE
CERTIFICATE OF CORRECTION

PATENT NO.        : 8,906,195 B2
APPLICATION NO.   : 12/621136
DATED             : December 9, 2014
INVENTOR(S)       : Aseem K. Srivastava et al.

It is certified that error appears in the above-identified patent and that said Letters Patent is hereby corrected as shown below:

In the Specification:
| | |
|---|---|
| Column 1, Line 65 | After "tuning", insert --.-- |
| Column 5, Line 20 | Delete "(N2O)." and insert --($N_2O$).-- |
| Column 5, Line 26 | Delete "N2O" and insert --$N_2O$-- |
| Column 5, Line 67 | Delete "ton" and insert --torr-- |
| Column 6, Line 2 | Delete "ton" and insert --torr-- |
| Column 7, Line 33 | Delete "220" and insert --208-- |
| Column 8, Line 59 | Delete "O+ and O-" and insert --$O^+$ and $O^-$-- |
| Column 8, Line 62 | Delete "O+" and insert --$O^+$-- |
| Column 8, Line 66 | Delete "O-" and insert --$O^-$-- |
| Column 9, Line 13 | Delete "N2O" and insert --$N_2O$-- |
| Column 9, Line 16 | Delete "N2O" and insert --$N_2O$-- |
| Column 9, Line 26 | Delete "N2O," and insert --$N_2O$,-- |
| Column 9, Line 30 | Delete "N2O" and insert --$N_2O$-- |
| Column 9, Line 34 | Delete "N2O" and insert --$N_2O$-- |
| Column 9, Line 36 | Delete "N2O" and insert --$N_2O$-- |
| Column 9, Line 43 | Delete "N2O" and insert --$N_2O$-- |
| Column 9, Line 48 | Delete "N2O" and insert --$N_2O$-- |
| Column 9, Line 49 | Delete "N2O" and insert --N2O-- |

In the Claims:
| | |
|---|---|
| Column 11, Line 51, Claim 3 | After "comprises", insert --different-- |
| Column 11, Line 60, Claim 5 | Delete "for" and insert --to-- |

Signed and Sealed this
Twenty-first Day of April, 2015

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 8,906,195 B2 | Page 1 of 1 |
| APPLICATION NO. | : 12/621136 | |
| DATED | : December 9, 2014 | |
| INVENTOR(S) | : Aseem K. Srivastava et al. | |

It is certified that error appears in the above-identified patent and that said Letters Patent is hereby corrected as shown below:

In the Specification:

Column 8, Line 36        Delete "CxHy," and insert --$C_xH_y$,--

Signed and Sealed this
Eighth Day of September, 2015

Michelle K. Lee
*Director of the United States Patent and Trademark Office*